United States Patent
Kishida et al.

[11] Patent Number: 6,051,120
[45] Date of Patent: Apr. 18, 2000

[54] THIN FILM FORMING APPARATUS

[75] Inventors: Shigeaki Kishida; Takashi Mikami; Hiroya Kirimura; Kiyoshi Ogata, all of Kyoto, Japan

[73] Assignee: Nissin Electric Co., Ltd., Kyoto, Japan

[21] Appl. No.: 09/198,584

[22] Filed: Nov. 24, 1998

[30] Foreign Application Priority Data

Nov. 28, 1997 [JP] Japan ................................ 9-344008

[51] Int. Cl.[7] .................................................. C23C 14/46
[52] U.S. Cl. ........................ 204/298.04; 298/192.11; 298/298.34; 298/298.36; 298/298.02; 298/298.06; 118/723 R; 118/723 FI; 118/723 E; 118/723 I
[58] Field of Search ................ 204/298.04, 192.11, 204/298.34, 298.36, 298.02, 298.06; 118/723 R, 723 FI, 723 E, 723 I

[56] References Cited

U.S. PATENT DOCUMENTS

| | | | |
|---|---|---|---|
| 4,885,070 | 12/1989 | Campbell et al. | 204/192.11 |
| 5,435,900 | 7/1995 | Gorokhovsky | 118/723 R |
| 5,622,635 | 4/1997 | Cuomo et al. | 427/457 |

FOREIGN PATENT DOCUMENTS

| | | |
|---|---|---|
| 1-205519 | 8/1989 | Japan . |
| 5-55194 | 3/1993 | Japan . |

*Primary Examiner*—Alan Diamond
*Attorney, Agent, or Firm*—Finnegan, Henderson, Farabow, Garrett & Dunner, L.L.P.

[57] ABSTRACT

There is provided a thin film forming apparatus in which plasma of high frequency is made of raw material gas in a film forming chamber 7, a thin film is formed on a surface of a substrate 12 in the film forming chamber 7 by the plasma of high frequency, and a characteristic of the thin film is controlled by irradiating ion beams 4 onto the surface of the substrate 12 at the same time, characterized in that: the substrate 12 is composed of a square plate having a regular square surface or a rectangular surface; and the thin film forming apparatus is provided with a high frequency electrode 13 for forming the plasma of high frequency into a cube or a rectangular parallelepiped to cover an overall surface of the substrate 12, on the surface side of the substrate 12.

16 Claims, 6 Drawing Sheets

PRIOR ART

THIN FILM FORMING APPARATUS

BACKGROUND OF THE INVENTION

1. Field of the Invention

The present invention relates to a thin film forming apparatus for forming a thin film on a surface of a square (regular square or rectangular) substrate.

2. Description of the Related Art

Conventionally, in the field of a thin film forming apparatus to which CVD (Chemical Vapor deposition) apparatus is applied, there is a demand to form a thin film of uniform film thickness and uniform film characteristic at low temperature so that the use of the thin film forming apparatus can be extended.

In order to meet the demand, the present applicant has already invented a thin film forming apparatus disclosed in JP-A(Japanese Unexamined Patent Publication) No. 5-55194.

According to the conventional thin film forming apparatus, plasma of high frequency is made of raw material gas in a film forming chamber; ion beams are drawn out from an ion source into the film forming chamber; both plasma and a surface of a substrate are irradiated with the ion beams; and a thin film of uniform thickness and uniform characteristic is accumulated and formed at low temperature on the substrate by the effect of migration of radicals in the plasma generated by the irradiation of the ion beams and also by the control of film quality.

In the same manner as that of the other existing apparatus such as a plasma CVD apparatus, in this thin film forming apparatus to which this type CVD apparatus is applied, a high frequency electrode for generating plasma of high frequency in the film forming chamber is cylindrical, and plasma of high frequency, the profile of which is spherical, is formed in a plasma generating region inside the electrode.

In this case, a cross-section of plasma of high frequency, which is parallel to the substrate, is circular. Concerning a disk-shaped substrate such as a silicon wafer, when a diameter of the high frequency electrode 1 is appropriately determined as shown in the plan view of FIG. 13, an overall surface of the circular substrate 2 is appropriately covered with plasma of high frequency, so that a thin film of uniform thickness and uniform characteristic can be effectively formed on the surface of the substrate 2.

However, concerning the square substrate, the surface of which is formed into a regular square or a rectangle, such as a glass substrate used for a liquid crystal display panel of TFT-LCD(Thin Film Transistor-Liquid Crystal Display Device), it is impossible to effectively utilize high frequency electric power and form a thin film of uniform thickness and uniform characteristic, which will be explained below.

That is, when it is attempted that a thin film of uniform thickness and uniform characteristic is formed on an overall surface of a square substrate by a conventional apparatus, it is necessary that a diameter of the high frequency electrode is set at a value longer than a diagonal line of the substrate so that plasma of high frequency can cover the overall surface of the substrate.

Even in the case of a regular square substrate, a hatched portion of plasma of high frequency, which protrudes from the substrate 2 as shown in FIG. 14(a), does not contribute to the formation of a film. Therefore, high frequency electric power is wasted, and it is impossible to enhance the film forming efficiency.

In order to prevent the film surface from being stained with a redundant thin film when the redundant thin film, which has been attached to a portion except for the substrate, is peeled off, it is necessary to conduct cleaning frequently, and the manufacturing cost is necessarily raised.

In the case of a rectangular substrate, a hatched portion of plasma of high frequency protruding from the substrate 2 is more increased than the case of a square substrate. Therefore, the film forming efficiency is further deteriorated, and it becomes necessary to conduct cleaning more frequently.

Consequently, the conventional apparatus is disadvantageous in that it is impossible to form a thin film of uniform thickness and uniform characteristic on the overall surface of the square substrate effectively.

In the conventional apparatus, ion beams are drawn out from an ion source into a film forming chamber so that a circular portion of the surface of the substrate can be irradiated with the ion beams.

Therefore, in the same manner as that of the above plasma of high frequency, when it is attempted that the overall surface of the square substrate is irradiated with ion beams, a waste portion of plasma of high frequency, which is not irradiated onto the substrate, is increased. From this viewpoint, it is impossible to effectively form a thin film of uniform thickness and uniform characteristic on the substrate.

When it is attempted that a thin film of uniform thickness and uniform characteristic is formed by the above type thin film forming apparatus, a diameter of the high frequency electrode must be larger than the size of the substrate. Therefore, it is impossible to reduce the size of the thin film forming apparatus.

When an area of the substrate is increased, an electric field of high frequency becomes nonuniform and unstable because of a delay of transmission of high frequency caused by an increase in the size of the high frequency electrode, and it becomes difficult to form plasma of high frequency uniformly. Therefore, a failure in thin film formation tends to occur.

SUMMARY OF THE INVENTION

It is an object of the present invention to effectively form a thin film of uniform thickness and uniform characteristic on a surface of a square substrate by utilizing electric power of high frequency effectively.

Also, it is an object of the present invention to form a thin film of uniform thickness and uniform characteristic on a surface of a substrate more effectively by irradiating ion beams on an overall surface of the square substrate while avoiding the occurrence of waste.

Further, it is an object of the invention to reduce a size of the thin film forming apparatus.

In addition to that, it is an object of the invention to form a thin film of uniform thickness and uniform characteristic on a square substrate, the area of which is large.

In order to accomplish the above objects, the thin film forming apparatus described in a first aspect of the present invention is composed as follows. The substrate is composed of a square plate having a regular square surface or a rectangular surface, and the thin film forming apparatus is provided with a high frequency electrode for forming the plasma of high frequency into a cube or a rectangular parallelepiped to cover an overall surface of the substrate, on the surface side of the substrate.

Namely a first aspect of an apparatus is a thin film forming apparatus of the present invention, which comprises:

a substrate composed of a square plate having a rectangular surface, disposed in a film forming chamber;

a high frequency generating means, having a high frequency electrode so as to form a plasma of high frequency in a shape of a rectangular parallelepiped, the long side of the cross-section parallel to the substrate surface of which is long enough to cover one side of the substrate surface, on the surface side of the substrate; and a means for irradiating ion beams onto the substrate surface so as to control a characteristic of the thin film.

Accordingly, unlike the conventional thin film forming apparatus in which plasma of high frequency is formed into a sphere, plasma of high frequency is formed into a cube or a rectangular parallelepiped in accordance with a profile of the surface of the square substrate, and an overall surface of the substrate is covered with plasma of high frequency while avoiding the occurrence of waste, so that electric power of high frequency can be used effectively, and an overall surface of the square or rectangular substrate can be effectively covered with a thin film of uniform thickness and uniform characteristic.

A second aspect of the apparatus is a thin film forming apparatus according to the first aspect, wherein the high frequency electrode is formed so that the profile of the plasma of the high frequency has a same shape as the substrate surface on the substrate surface, and covers an entire substrate surface.

A third aspect of the apparatus is a thin film forming apparatus according to the first aspect, wherein the high frequency generating means has a plurality of power supplying parts and generate a high frequency in the UHF range.

A fourth aspect of the apparatus is a thin film forming apparatus according to the third aspect, wherein the power supplying parts are arranged in a manner having same intervals along the high frequency electrode surface on a plane parallel to the substrate surface.

A fifth aspect of the apparatus is a thin film forming apparatus according to the first aspect, wherein the high frequency is within a range between 27 MHz and 216 MHz.

The present invention described in sixth aspect provides a thin film forming apparatus according to the first aspect in which ion beams are drawn into the film forming chamber through the plasma of high frequency so that the surface of the substrate can be irradiated with the ion beams, and the thin film forming apparatus is provided with an ion source, the profile of which is formed so that an irradiating surface of the substrate of the ion beams can be formed into a regular square or a rectangle by which the overall surface of the substrate is irradiated.

Namely the sixth aspect of the apparatus is a thin film forming apparatus according to second aspect, wherein the means for irradiating ion beams comprises an ion source so that ion beams are drawn into the film forming chamber through the plasma of high frequency and irradiate an entire surface of the substrate.

Accordingly, an irradiating surface of the substrate irradiated with ion beams, which have been drawn out from the ion source and irradiated on the surface of the substrate, becomes a square or a rectangle which covers the overall surface. Accordingly, a waste irradiation of ion beams can be prevented, and a waste in electric power can be further decreased, and a portion such as a substrate holder, which is except for the substrate, can not be irradiated with ion beams. Accordingly, a harmful effect caused by an unnecessary heating conducted by the irradiation of ion beams can be prevented. Therefore, it is possible to form a thin film of uniform thickness and uniform characteristic on the square substrate.

The present invention described in a seventh aspect provides a thin film forming apparatus characterized in that: the substrate is composed of a square plate having a rectangular surface; the thin film forming apparatus is provided with a high frequency electrode for forming the plasma of high frequency into a rectangular parallelepiped, the long side of the cross-section parallel to the surface of the substrate of which is long enough to cover one side of the substrate, on the surface side of the substrate; and the thin film forming apparatus is provided with a substrate moving means for moving the substrate in the direction of a short side of the cross-section.

Accordingly, concerning the plasma of high frequency, the profile of which is a rectangular parallelepiped, formed by the high frequency electrode, a short side of the rectangular cross-section parallel to the substrate is shorter than the substrate, so that only a portion of the surface of the substrate can be covered with the plasma of high frequency, however, since the substrate moving means moves the substrate in a direction of the short side, the overall surface of the substrate is successively covered with the plasma of high frequency. Therefore, the overall surface of the substrate can be covered with a thin film of uniform thickness and uniform characteristic.

In this case, it is possible to form a thin film of uniform thickness and uniform characteristic effectively on a rectangular surface irrespective of the substrate size by a small structure in which an interval between the opposing surfaces of one of the high frequency electrodes is made to be smaller than the substrate.

The present invention described in an eighth aspect provides a thin film forming apparatus according to the seventh aspect in which ion beams are drawn out into the film forming chamber through the plasma of high frequency so that the surface of the substrate can be irradiated with the ion beams. The thin film forming apparatus is provided with an ion source for irradiating the ion beams onto the surface of the substrate of which is a rectangle which coincides with a region in which film formation is conducted in the film forming chamber.

Accordingly, ion beams drawn out from the ion source into the film forming chamber are effectively irradiated onto the substrate. Therefore, according to the same action as that described in the sixth aspect, a size of the thin film forming apparatus can be further reduced and it becomes possible to form a thin film of uniform thickness and uniform characteristic.

Ninth, tenth and eleventh aspects of the present invention provide a thin film forming apparatus according to the first aspect, wherein high frequency electrodes are formed in such a manner that a plurality of electrodes, especially four plate electrodes are arranged into a square on the surface side of the substrate in the film forming chamber being electrically insulated from each other, and the thin film forming apparatus is provided with a high frequency electric power feeding means for feeding a high frequency electric power individually to each plate electrode so that an intensity of electric power fed to each plate electrode can be individually controlled. Due to the foregoing, it is possible to accurately control a distribution of the plasma of high frequency in accordance with a profile and size of the substrate. Therefore, it becomes possible to form a thin film of uniform thickness and uniform characteristic. Especially, it is possible to form a thin film of uniform thickness and uniform characteristic of a large square substrate, the area of which is large.

The present invention provides a thin film forming apparatus according to each aspect described above, wherein high frequency electrodes are formed in such a manner that a plurality of electrodes, especially four plate electrodes are arranged into a square on the surface side of the substrate in the film forming chamber being electrically insulated from each other, and the thin film forming apparatus is provided with a high frequency electric power feeding means for feeding a high frequency electric power respectively between two plate electrodes opposed to each other. Therefore, it is possible to conduct a distribution control of plasma of high frequency in the same manner as that described before. Especially, the feed of electric power of high frequency in two directions perpendicular to each other in accordance with a ratio of the long side to the short side on the surface of the substrate can be accurately controlled. Accordingly, it is possible to prevent the occurrence of an error in the control of feed of electric power, and the distribution of plasma of high frequency can be controlled to a target value.

According to a twelfth aspect, When the thin film forming apparatus is provided with a means for synchronizing high frequency phases, which is impressed upon the plate electrodes or between the two plate electrodes opposed to each other, it is possible to form a thin film of more uniform thickness and more uniform characteristic.

A thirteenth aspect of the apparatus is a thin film forming apparatus according to the first aspect, wherein the means for irradiating ion beams introduces the ion beams to the thin film forming chamber through a rectangular slit.

A fourteenth aspect of the apparatus is a thin film forming apparatus according to the first aspect, wherein the means for irradiating ion beams introduces the ion beams to the thin film forming chamber through a slit matches with a size of the substrate.

A fifteenth aspect of the apparatus is a thin film forming apparatus according to the first aspect, wherein the means for irradiating ion beams introduces the ion beams to the thin film forming chamber through a plurality of holes formed on a slit plate.

A sixteenth aspect of the apparatus is a thin film forming apparatus according to the first aspect, wherein the means for irradiating ion beams introduces the ion beams to the thin film forming chamber through a beam shielding plate having a slit matched with a long side of the substrate on which the thin film is to be formed.

Accordingly, ion beams drawn out from the ion source into the film forming chamber are effectively irradiated onto the substrate. Therefore, according to the same action as that described in the sixth aspect, a size of the thin film forming apparatus can be further reduced and it becomes possible to form a thin film of uniform thickness and uniform characteristic.

DESCRIPTION OF THE PREFERRED EMBODIMENTS

Referring to FIGS. 1 to 12, embodiments of the present invention will be explained below.

FIRST EMBODIMENT

First, referring to FIGS. 1 and 2, the first embodiment of the present invention will be explained.

Figure 1:
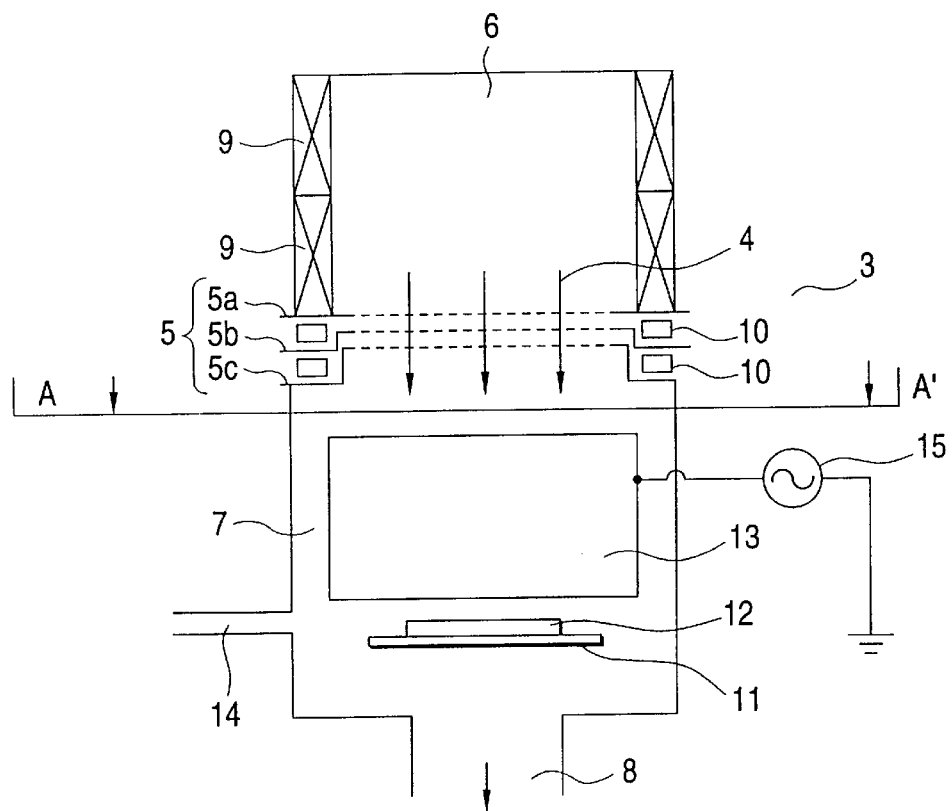
FIG. 1 is an arrangement view of the apparatus of the first embodiment of the present invention.

FIG. 1 is a view showing an arrangement of the apparatus. The vacuum chamber 3 is divided into the upper ion source chamber 6 and the lower film forming chamber 7 by the drawing electrode 5 to draw out ion beams 4. Vacuum discharge is always conducted at the discharge port 8 located at a lower position of the film forming chamber 7.

When gas of ion species is introduced into the ion source chamber 6 from a gas introducing port not shown in the drawing, this gas is made into plasma by high frequency discharge or microwave discharge, and ion beams 4 are drawn out from the ion source chamber 6 into the film forming chamber 7 by the drawing electrode 5.

In this connection, reference numeral 9 shown in the view is a magnetic field generating means such as a permanent magnet or a coil. This magnetic field generating means composes an ion source together with the drawing electrode 5 and the ion source 6.

Concerning the drawing electrode 5, there are provided three types of drawing electrodes 5a, 5b, 5c which are arranged in order from the ion source chamber 6. In this case, the electrode 5a is used for acceleration, the electrode 5b is used for deceleration, and the electrode 5c is used for ground. Insulators 10 are arranged among the electrodes 5a to 5c.

In the film forming chamber 7, the substrate holder 11 is arranged horizontally at an upper position of the discharge port 8. At a position on this substrate holder 11 irradiated with the ion beams 4, there is provided a square substrate 12, the surface of which is regular square or rectangular, such as a glass substrate of TFT-LCD.

At an upper position of this substrate 12, there is provided a high frequency electrode 13. This high frequency electrode 13 is not a conventional cylindrical electrode. As shown in FIG. 2 which is a view of the film forming chamber 7 taken on line A–A' in FIG. 1, the electrode is composed of a hollow cube or a hollow rectangular parallelepiped, the section parallel to the substrate 12 of which is a square or a rectangle which surrounds the substrate 12.

In this connection, on an outer circumference of the film forming chamber 7, there is provided a magnetic field generating means composed of a permanent magnet or a coil which is not shown in the view.

Raw material gas is introduced from the gas introducing port 14 into the film forming chamber 7, and an appropriate high frequency electric power source 15 is turned on and connected to the high frequency electrode 13 under the above condition, so that electric discharge is started. Due to the above electric discharge, plasma of high frequency is formed in a space inside the high frequency electrode 13. Raw material gas is dissociated and activated by this plasma of high frequency.

By this dissociation and activation, film forming species such as ions and radicals are accumulated on a surface of the substrate 12, and a thin film is formed on the substrate 12.

At the same time, ion beams 4 are irradiated on the surface of the substrate 12 through plasma of high frequency. Characteristics of the film formed on the substrate 12 such as crystallization and orientation are controlled so that they can be made uniform.

At this time, in accordance with a profile of the high frequency electrode 13, an electric field, the profile of which is a cube or a rectangular parallelepiped covering only the surface of the substrate 12, distributes inside the high frequency electrode 13. Therefore, plasma of high frequency of this profile is formed. In accordance with this distribution of plasma, the above film forming species distribute only on the surface of the substrate 12. Therefore, a thin film is deposited and formed only on the surface of the substrate 12.

The thin film seldom adheres to a portion such as a substrate holder 11 except for the substrate. Therefore, electric power of high frequency is not wasted, and a thin film can be effectively formed. Further, the thin film seldom adheres to a portion except for the substrate. Accordingly, there is no possibility that an unnecessary thin film is peeled off and a film forming surface of the substrate 12 is stained with this peeled thin film. Therefore, cleaning work can be reduced.

Accordingly, on the overall square or rectangular surface of the substrate 12, a thin film of uniform thickness and uniform characteristic can be effectively formed.

In this connection, profiles of the ion source chamber 6 and the film forming chamber 7 may be either cubic, rectangular parallelepiped or cylindrical.

In this embodiment, by using a high frequency in the UHF range (10–500 MHz), especially 27–216 MHz, more uniform high density of plasma can be generated and high quality thin film can be formed on the substrate without being damaged.

In the case that high frequency in the UHF range (10–500 MHz) is used, three advantages are obtained as follows.

(1) Plasma density is able to be incresed.
(2) High density of plasma can be obtained by applying a low power.
(3) Plasma potential can be lowered and plasma damage to the substrate is reduced.

Comparison with the RF range, high frequency wave of UHF range is difficult to be transferred. Therefore preferably plurality of power supplying means are disposed at plurality parts of the electrodes 13.

SECOND EMBODIMENT

Next, referring to FIGS. 3 to 6, the second embodiment of the present invention will be explained below.

Figure 3:
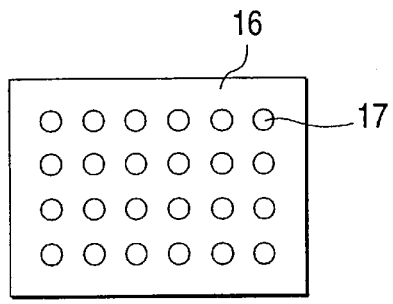
FIG. 3 is a plan view of the electrode plate of the ion beam drawing electrode of the second embodiment of the present invention.

In this second embodiment, in order to make the ion beams 4 of the first embodiment irradiate onto only the surface of the substrate 12, all the electrodes 5a to 5c composing the drawing electrode 5 or some of the electrodes are composed of the electrode 16 shown in FIG. 3.

In this electrode 16, an appropriate number of drawing holes 17 are uniformly formed only in a square or rectangular region which overlaps the substrate 12. When ion beams 4 are drawn out from these drawing holes 17, a profile of the irradiating surface on the substrate 12, which is irradiated with the ion beams 4, becomes a square or a rectangle which overlaps the surface of the substrate 12.

Accordingly, in this embodiment, plasma of high frequency is formed into a cube or a rectangular parallelepiped which substantially covers the surface of the substrate 12, and the ion beams 4 irradiate only the surface of the substrate 12. Therefore, an unnecessary irradiation of the ion beams 4 can be prevented. Consequently, electric power consumption by the ion beams 4 can be reduced, and a thin film can be effectively formed at low cost.

It is possible to prevent a raise of temperature in a portion except for the substrate such as a substrate holder 11 in the irradiation of the ion beams 4. Accordingly, the film forming characteristic can be further enhanced.

In this connection, in the case where the ion source chamber 6 and the film forming chamber 7 are cylindrical in the same manner as that of the conventional apparatus and the drawing electrode 5 is circular, irradiation of the ion beams may be controlled as follows instead of arranging the square electrode 16.

Figure 4:
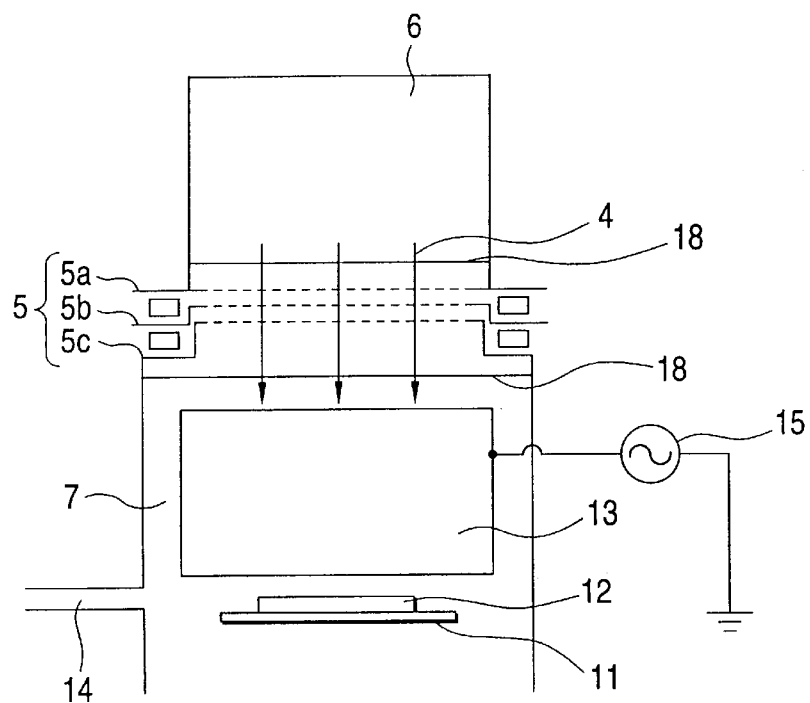
FIG. 4 is an arrangement view of the apparatus in the case of restricting ion beams with a shield plate.
Figure 5:
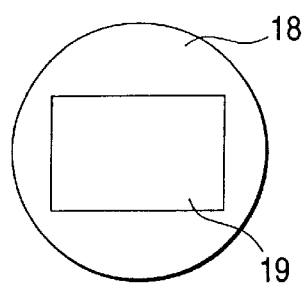
FIG. 5 is a plan view of the shield plate shown in FIG. 4.

As shown in FIGS. 4 and 5, a disk-shaped shield plate 18 is provided at a position either immediately before the drawing electrode 5 in the ion source chamber 6 or immediately after the drawing chamber 5 in the film forming chamber 7.

On this shield plate 18, there is formed a drawing opening 19 in a portion which substantially overlaps the surface of the substrate 12. Ion beams 4 can be drawn out from this opening 19 so that only the surface of the substrate 12 can be irradiated with the ion beams 4.

Figure 6A:
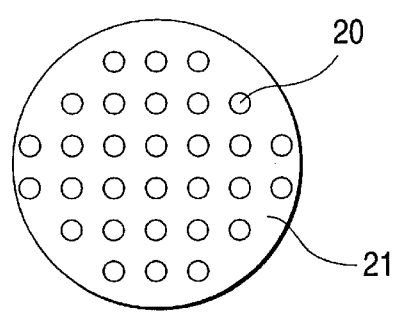
FIG. 6(a) is a plan view showing a porous type electrode plate used as a drawing electrode for drawing ion beams.
Figure 6B:
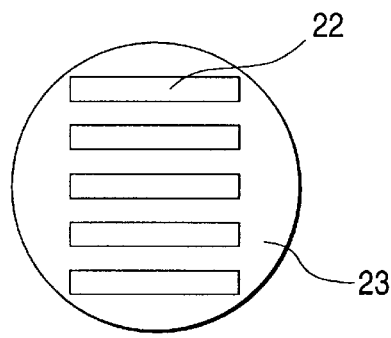
FIG. 6(b) is a plan view showing a slit type electrode plate used as a drawing electrode for drawing ion beams.

Next, instead of arranging the shield plate 18, all the drawing electrodes 5 or some of the electrodes 5a to 5c may be changed from the electrode 21 shown in FIG. 6(a) in which a large number of drawing holes 20 are uniformly formed, to the electrode 23 shown in FIG. 6(b) in which a plurality of rectangular drawing slits 22 are formed only in a portion which overlaps the surface of the substrate 12.

Also, in this case, ion beams 4 are drawn out from each drawing slit 22 so that only the substantial surface of the substrate 12 can be irradiated with the ion beams 4.

In this connection, in the case where the ion source chamber 6 and the film forming chamber 7 are not cylindrical, the shield plate 18 and the electrode 23 may be provided.

THIRD EMBODIMENT

Next, referring to FIG. 7, the third embodiment of the present invention will be explained below.

Figure 2:
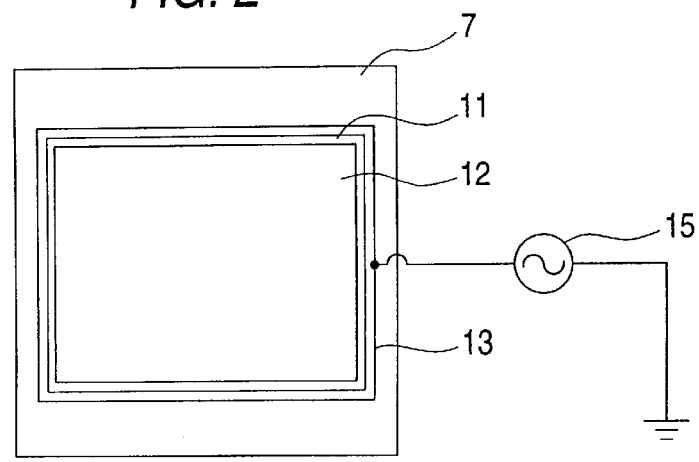
FIG. 2 is a partially plan view taken on line A–A' in FIG. 1.
Figure 7:
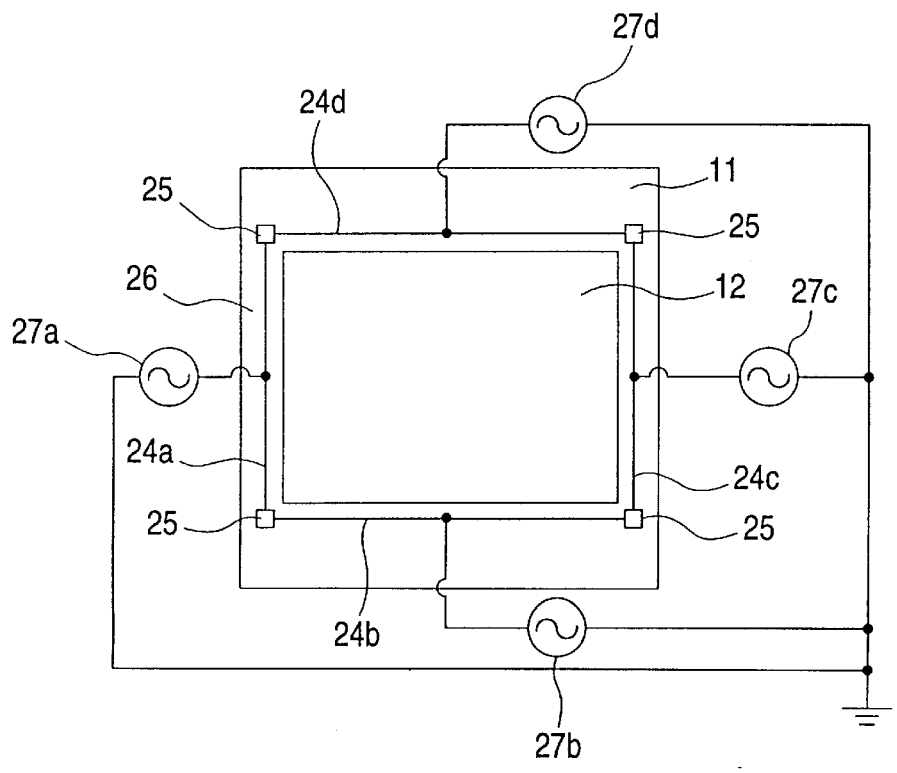
FIG. 7 is a plan view of the third embodiment of the present invention.

In the same manner as that of FIG. 2, FIG. 7 is a plan view showing a portion of the film forming chamber 7. As shown in FIG. 7, in this embodiment, instead of the high frequency electrode 13 in the first embodiment, four plate electrodes 24a to 24d are arranged at the position of the electrode 13 via the insulator 25, that is, four plate electrodes 24a to 24d are arranged being formed into a square frame. In this way, a split type high frequency electrode 26 is provided.

There are provided four high frequency power sources 27a to 27d which form a high frequency power feeding means. High frequency power is individually supplied from the four high frequency power sources 27a to 27d to the plate electrodes 24a to 24d, so that the electric power supplied to the plate electrodes 24a to 24d can be individually controlled.

When the electric power supplied to the plate electrodes is individually controlled, an electric field distribution in a space inside the high frequency electrode 26, which is a high frequency plasma forming region, can be freely controlled, and plasma of high frequency can be controlled.

Therefore, especially when the substrate 12 is large, that is, especially when an area of the substrate is large, it is possible to make plasma of high frequency uniform, and a thin film of high quality can be formed.

In the case where electric power is supplied from the single high frequency power source 15 to the high frequency electrode 13 like the first embodiment, when the size of the substrate 12 is increased, the size of the high frequency electrode 13 is also increased in accordance with the increase in the size of the substrate 12. Therefore, transmission of high frequency is delayed, and a distribution of the electric field in a space inside the high frequency electrode tends to become nonuniform and unstable. As a result, the high frequency plasma can not be uniformly formed, and a thin film can not be uniformly formed on the substrate 12. In this way, there is a possibility that the quality of a formed film is deteriorated.

On the other hand, in the third embodiment, when the plate electrodes 24a to 24d is individually supplied with electric power from the high frequency power source 27a to 27d, an intensity of electric power supplied to each plate electrode 24a to 24d can be individually controlled. Even if the substrate 12 is a large substrate, the area of which is large, it is easy to make a distribution of electric field in a space inside the high frequency electrode 26 uniform and stable, and further cracking of raw material gas can be facilitated, so that plasma of high frequency can be made uniform and a uniform thin film can be formed on the substrate 12.

Since uniform plasma of high frequency can be formed in a space inside the high frequency electrode 26, the size of the electrode is not unnecessarily increased, which is not like a case in which a more uniform thin film is formed in a portion inside the high frequency electrode 13 where plasma is uniformly formed. Therefore, this embodiment is advantageous in that the size of the apparatus is reduced and it is possible to form a thin film of uniform thickness and uniform characteristic on the substrate 12, the area of which is large. In this case, electric power consumption is small and a thin film can be effectively formed at low cost.

FOURTH EMBODIMENT

Next, referring to FIG. 8, the fourth embodiment of the present invention will be explained below.

Figure 8:
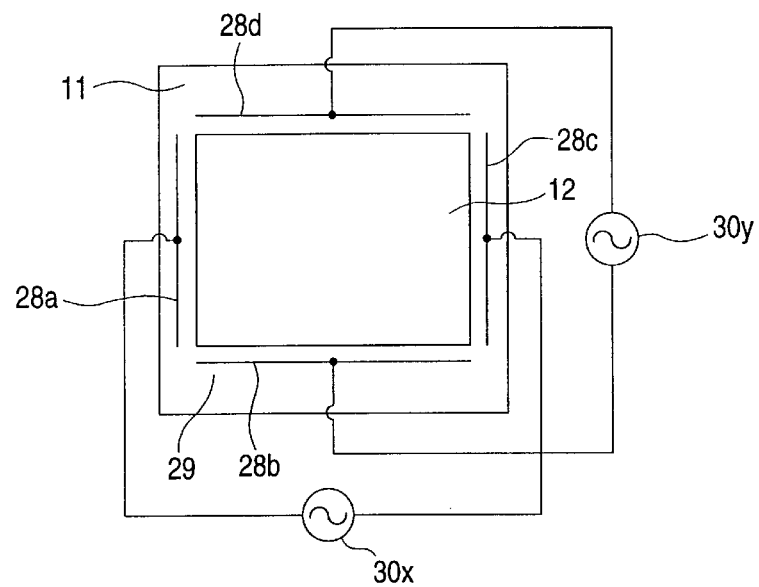
FIG. 8 is a plan view of the fourth embodiment of the present invention.

FIG. 8 is a plan view made in the same manner as that of FIG. 7. As shown in FIG. 8, in this embodiment, four plate electrodes 28a to 28d are arranged into a square in such a manner that clearances are made between them, and the high frequency electrode 29, which is the same as the electrode 26 shown in FIG. 7, is arranged at a position of the high frequency electrode 26, and the high frequency electric power source 30x supplies high frequency electric power to between two plate electrodes 28a, 28c which are opposed to each other, and also the high frequency electric power source 30y supplies high frequency electric power to between two plate electrodes 28b, 28d which are opposed to each other.

In this case, when a ratio of high frequency electric power supplied to the two plate electrodes 28a, 28c by the high frequency electric power source 30x, to high frequency electric power supplied to the two plate electrodes 28b, 28d by the high frequency electric power source 30y, is set at the same value as that of a ratio of the sides of the substrate 12, it is possible to accurately form uniform plasma of high frequency on the surface of the substrate 12.

Therefore, especially when the substrate 12 is a square substrate, the surface of which is rectangular, electric power to be inputted from the high frequency electric power sources 30x, 30y so as to form uniform high frequency plasma can be easily and accurately determined in accordance with a ratio of the long side to the short side of the substrate.

FIFTH EMBODIMENT

Next, referring to FIG. 9, the fifth embodiment of the present invention will be explained below.

Figure 9:
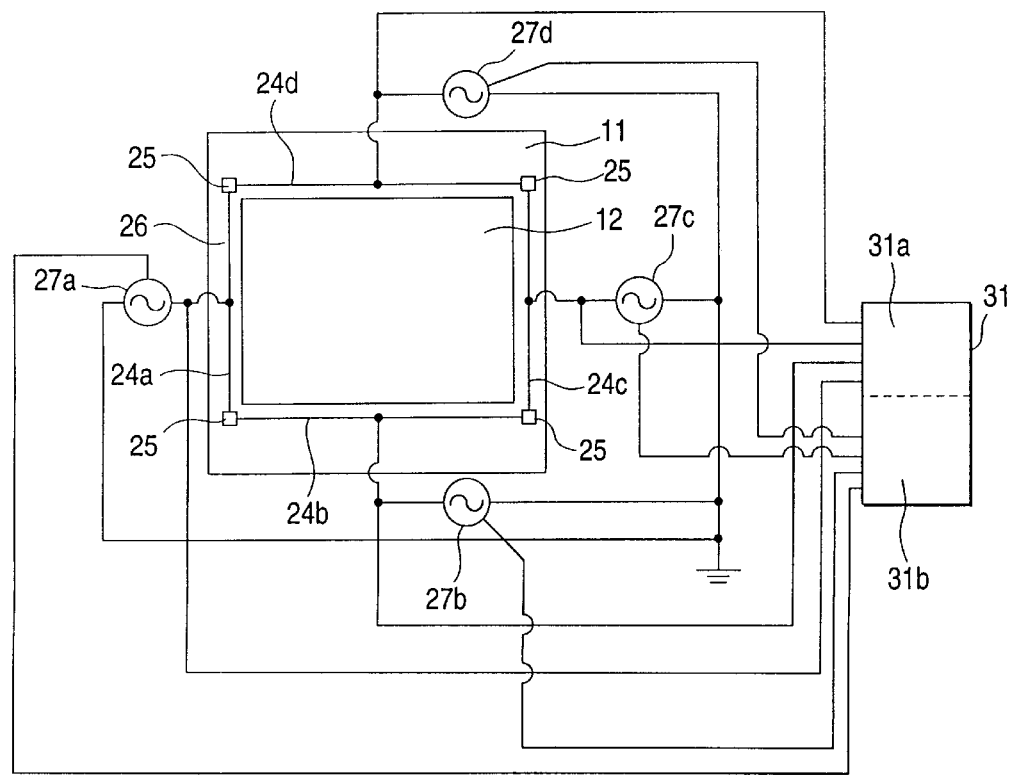
FIG. 9 is a plan view of the fifth embodiment of the present invention.

The fifth embodiment shown in FIG. 9 is composed as follows. In FIG. 9, the phase control unit 31 is added to the structure shown in FIG. 7. An output phase of each high frequency power source 27a to 27d is monitored and detected by the phase input section 31a of this unit 31. According to the result of detection, a phase of high frequency of each high frequency power source 27a to 27d is controlled by the phase control signal output section 31b of the unit 31, so that a phase of high frequency impressed upon each plate electrode 24a to 24d can be synchronized.

In this case, it is possible to prevent the occurrence of turbulence of the electric field in the space of plasma caused by a phase shift of high frequency voltage impressed upon each plate electrode 24a to 24d. Therefore, in this embodiment, it is possible to form more stable plasma of high frequency than that of the embodiment shown in FIG. 7.

SIXTH EMBODIMENT

Next, referring to FIG. 10, the sixth embodiment of the present invention will be explained below.

Figure 10:
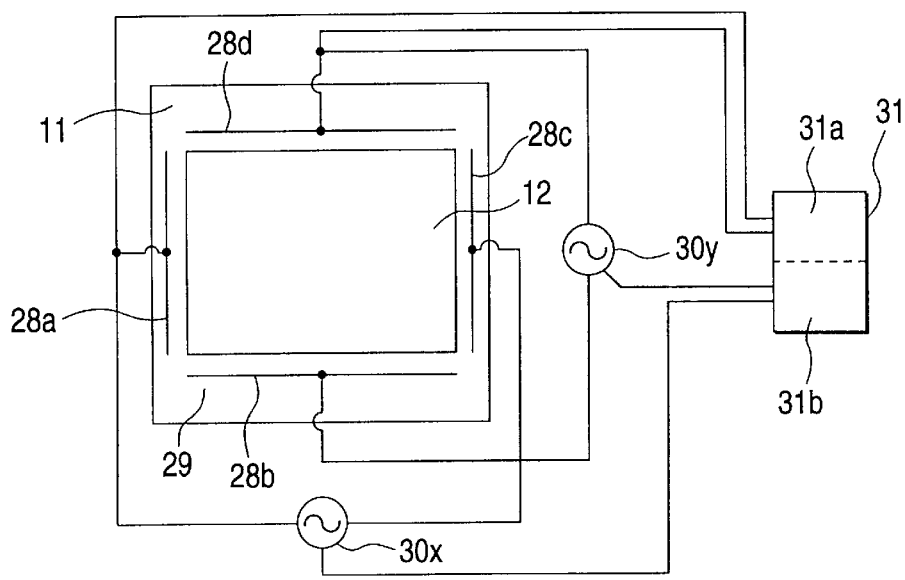
FIG. 10 is a plan view of the sixth embodiment of the present invention.

The sixth embodiment shown in FIG. 10 is composed as follows. In FIG. 10, the phase control unit 31 is added to the structure shown in FIG. 8. Phases of high frequency of the high frequency power sources 30x, 30y impressed upon the two plate electrodes 28a, 28c, which are opposed to each other, and also impressed upon the two plate electrodes 28b, 28d, which are opposed to each other, are controlled by the phase input section 31a of this unit 31. In this way, the phase of high frequency impressed upon the two plate electrodes 28a, 28c, which are opposed to each other, can be synchronized with the phase of high frequency impressed upon the two plate electrodes 28b, 28d, which are opposed to each other.

In this case, it is possible to prevent the occurrence of turbulence of the electric field in the space of plasma. Therefore, in this embodiment, it is possible to form more stable plasma of high frequency than that of the embodiment shown in FIG. 8.

SEVENTH EMBODIMENT

Next, referring to FIGS. 11 and 12, the seventh embodiment of the present invention will be explained below.

Figure 11:
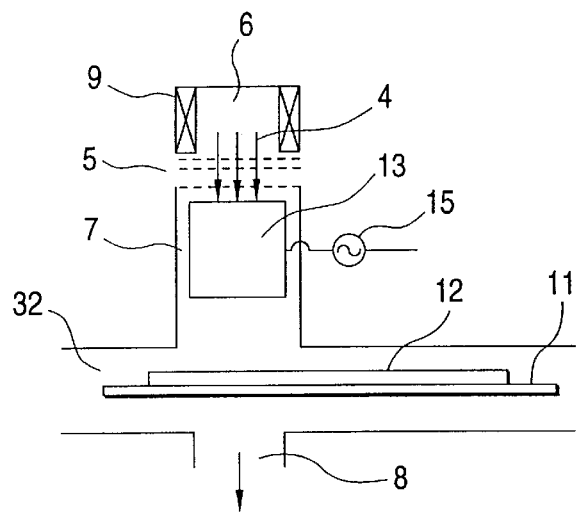
FIG. 11 is a plan view of the seventh embodiment of the present invention.
Figure 12:
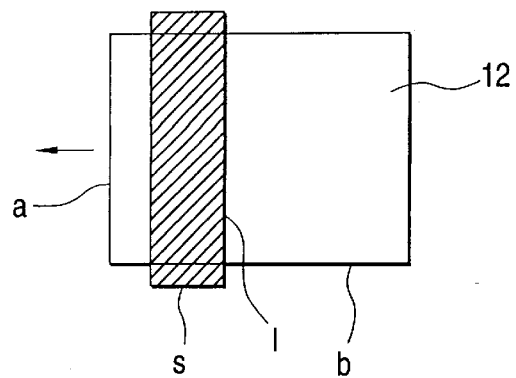
FIG. 12 is a plan view of the substrate shown in FIG. 11.
Figure 13:
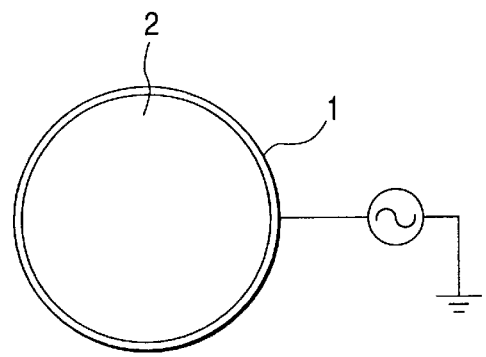
FIG. 13 is a plan view of the conventional apparatus.
Figure 14:
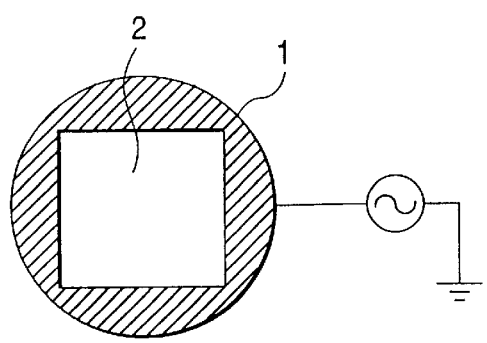
FIGS. 14(a) and 14(b) are respectively plan views for explaining the film formation on a square substrate conducted by the conventional apparatus.
Figure 14:
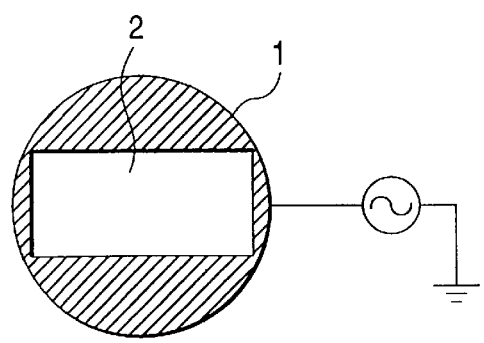

FIG. 11 is a view showing an overall arrangement, and FIG. 12 is a plan view of the substrate. Like reference characters are used to indicate like parts in FIGS. 1 and 2 and in FIGS. 11 and 12.

In this embodiment, the substrate 12 is long compared with the size of plasma of high frequency. Therefore, as shown in FIG. 11, there is provided a substrate conveyance passage 32 formed in the horizontal direction in the film forming chamber 7. The substrate 12, which is put on the substrate holder 11, is moved along the conveyance passage 32 by a substrate moving means such as a conveyer.

Plasma of high frequency formed on the surface of the substrate 12 by the high frequency electrode 13 is a rectangular parallelepiped. As shown in the hatched portion of FIG. 12, the long side 1 of the cross-section of plasma of high frequency parallel to the substrate is sufficiently long to cover one side (short side in the view) "a" of the substrate 12.

When the substrate 12 is moved in a direction of the short side "s" of the cross-section of plasma of high frequency, that is, when the substrate 12 is moved in a direction of the long side "b" of the substrate 12, a portion of the substrate 12 covered with plasma of high frequency is moved, so that a thin film can be formed on the overall surface of the substrate 12.

At this time, plasma of high frequency substantially covers only the surface of the substrate 12, and an unnecessary thin film is not formed in a portion except for the substrate. Therefore, in the same manner as that of the first embodiment and others, a thin film of uniform thickness and uniform characteristic can be effectively formed.

Irrespective of the size of a substrate, it is possible to effectively form a thin film of uniform thickness and uniform characteristic on the overall surface of the substrate 12 by a structure of a small electrode in which a portion of the surface of the substrate 12 is covered with plasma of high frequency. Therefore, the apparatus can be made compact.

In this connection, when a side of the substrate 12 is a long side "b" shown in FIG. 12 and plasma of high frequency is a rectangular parallelepiped, the long side 1 of which covers the long side "b" of the substrate 12, the substrate 12 may be moved in a direction of the short side "s" of plasma of high frequency.

In this connection, in the seventh embodiment, when irradiation of ion beams 4 is controlled like the second embodiment and only a portion of the substrate 12 covered with plasma of high frequency is irradiated with the ion beams 4, of course, it becomes possible to effectively form a thin film of uniform thickness and uniform characteristic on the overall surface of the substrate 12 at low cost.

Instead of the high frequency electrode 13, the split type high frequency electrode 26, 29 described in the third or the fourth embodiment may be arranged so as to form plasma of high frequency. In this case, it is preferable that the phase control unit 31 described in the fifth or the sixth embodiment is added.

EXAMPLES

Next, examples of the present invention will be explained below.

Example 1

First, Example 1 is explained below which is like the first embodiment. In this example, as shown FIGS. 1 and 2, the high frequency electrode 13 is formed into a hollow cube or a hollow rectangular parallelepiped, the section of which is similar to the substrate 12, and plasma of high frequency is formed into a cube or a rectangular parallelepiped which covers the overall surface of the substrate 12.

The substrate 12 was formed into a rectangular plate, the size of which was 300 mm×400 mm. The high frequency electrode 13 was formed into a hollow rectangular parallelepiped, the size of which was 350 mm×450 mm. Electric power, the intensity of which was 800 W, was inputted from the high frequency power source into the high frequency electrode 13, so that the formation of a film was conducted. As a result, both the ratio of uniformity of film thickness and the ratio of uniformity of film characteristic were ±5%.

A range of the formation of an unnecessary film formed in a region except for the substrate was reduced to about 70% which was the same as that of the conventional apparatus in which the formation of a film is conducted by the cylindrical high frequency electrode.

Example 2

Next, Example 2 will be explained below in which the high frequency electrode 26 shown in FIG. 7 was arranged instead of the high frequency electrode 13 so as to form a film.

That is, electric power, the intensity of which was 200 W, was inputted into each plate electrode 24a to 24d of the high frequency electrode 26, and the formation of a film was conducted on the same substrate 12 as that of Example 1. As a result, both the ratio of uniformity of film thickness and the ratio of uniformity of film characteristic were ±4%. Both the ratios were more enhanced than those of Example 1 by about 1%.

Further, as shown in FIG. 9, the phase control unit 31 was arranged, and the phases of high frequencies impressed upon the plate electrodes 24a to 24d were synchronized with each other. As a result, both the ratio of uniformity of film thickness and the ratio of uniformity of film characteristic were ±3.7%, that is, both the ratio of uniformity of film thickness and the ratio of uniformity of film characteristic were further enhanced.

Example 3

Next, Example 3 will be explained below in which the high frequency electrode 29 shown in FIG. 8 was arranged and film formation was conducted.

The high frequency electric power source 30x supplied high frequency electric power to between two plate electrodes 28a, 28c which were opposed to each other, and also the high frequency electric power source 30y supplied high frequency electric power to between two plate electrodes 28b, 28d which were opposed to each other, so that film formation was conducted. At this time, the substrate 12 was formed into a rectangular plate in the same manner as that of Examples 1 and 2, and according to a ratio of the long side to the short side, electric power, the intensity of which was 300 W, was inputted from the power source 30x on the short side, and electric power, the intensity of which was 400 W, was inputted from the power source 30y on the long side. As a result, both the ratio of uniformity of film thickness and the ratio of uniformity of film characteristic were ±4%.

Further, as shown in FIG. 10, the phase control unit 31 was arranged, and the phases of high frequencies impressed upon the electrodes 28a, 28c on the short side were synchronized with the phases of high frequencies impressed upon the electrodes 28b, 28d on the long side. As a result, both the ratio of uniformity of film thickness and the ratio of uniformity of film characteristic were ±3.5%, that is, both the ratio of uniformity of film thickness and the ratio of uniformity of film characteristic were further enhanced.

Example 4

Next, Example 4 will be explained below in which the substrate 12 was moved so as to form a thin film.

In this example, a cross-section of the high frequency electrode 13 shown in FIG. 11, which is parallel to the substrate 12, was formed into a hollow rectangular parallelepiped, the size of which was 350 mm×100 mm. Electric power, the intensity of which was 200 W, was inputted from the high frequency power source 15 into the high frequency electrode 13, so that plasma of high frequency was formed, the profile of which was a rectangular parallelepiped, the cross-section parallel to the substrate 12 of which was 350 mm (long side l)×100 mm (short side s).

The surface irradiated with the ion beams 4 was determined to be a portion, the size of which was 350 mm×100 mm, which overlapped a portion of the substrate 12 covered with plasma of high frequency.

Then, the size of the substrate 12 was determined to be 300 mm (short side "a")×400 mm (long side "b"), and as shown in FIG. 12, the substrate 12 was put on the substrate holder 11 in such a manner that the long side "l" of high frequency plasma could be parallel to the short side "a" of the substrate 12, and film formation was conducted while the substrate 12 was being moved in a direction of the long side "b".

As a result, a thin film of uniform thickness and uniform characteristic was formed on the overall surface of the substrate 12, wherein both the ratio of uniformity of film thickness and the ratio of uniformity of film characteristic were ±3%.

In this example, a period of time for forming one substrate was approximately four times as long as that of Example 1, however, an intensity of inputted electric power was reduced to ¼, and uniformity of thickness was enhanced.

In each example described above, the high frequency was set at 13.56 MHz. However, it should be noted that the present invention is not limited to the above specific high frequency. RF range and UHF Range can be applicable to the present invention.

It is possible for the present invention to provide the following effects.

The invention described in the first-fifth aspects provides the following effects. Unlike plasma of high frequency of the conventional apparatus, plasma of high frequency in the case of claim 1 is not spherical but formed into a cube or a rectangular parallelepiped in accordance with a profile of the surface of the square substrate 12. Accordingly, the overall surface of the substrate 12 is effectively covered with plasma of high frequency. Therefore, electric power of high frequency can be effectively used, and a thin film of uniform thickness and uniform characteristic can be formed on the overall surface of the square or rectangular substrate 12.

The invention described in the sixth provides the following effects. An irradiation surface of the substrate 12 irradiated with the ion beams 4 drawn out from the ion source into the film forming chamber 7 is formed into a square or a rectangle which covers the overall surface of the substrate 12. Therefore, the ion beams 4 are not wasted in the irradiation, and electric power consumption can be further reduced. At the same time, a portion such as a substrate holder, which is except for the substrate, is not irradiated with the ion beams 4. Therefore, the portion is prevented from heating and rising in temperature. Accordingly, a thin film can be more effectively formed on the square substrate 12.

The invention described in the seventh aspect provides the following effects. The substrate moving means moves the substrate 12 in the direction of the short side "s" of plasma of high frequency. Therefore, portions on the surface of the substrate 12 are successively covered with plasma of high frequency one by one, so that a thin film of uniform thickness and uniform characteristic can be formed on the overall surface of the substrate 12. At this time, plasma of high frequency substantially covers only the surface of the substrate 12. Accordingly, irrespective of the size of the substrate, it is possible to effectively form a thin film of uniform thickness and uniform characteristic by a small structure having a small electrode, the plasma of high frequency of which covers only a portion of the surface of the rectangle substrate 12.

The invention described in the eighth aspect provides the following effects. The substrate 12 is effectively irradiated with the ion beams 4 drawn out from the ion source into the film forming chamber 13 in the apparatus having the structure described in claim 3 in which the substrate 12 is moved. Accordingly, by the same action as that of claim 2, it is possible to effectively form a thin film of uniform thickness and uniform characteristic on the substrate 12.

The invention described in the ninth-eleventh aspects provides the following effects. Electric power of high frequency is individually supplied to the plate electrodes 24a to 24d forming the high frequency electrode 26, and electric power inputted into the plate electrodes 24a to 24d is individually controlled. Accordingly, it is possible to accurately control a distribution of plasma of high frequency in accordance with the profile and size of the substrate 12 in the apparatuses of claims 1 to 4. Therefore, it is possible to form a thin film of more uniform thickness and more uniform characteristic. Especially, it is possible to form a thin film of uniform thickness and uniform characteristic on a large square substrate, the area of which is large.

The invention provides the following effects. In accordance with a ratio of the long side to the short side of the substrate 12, a ratio of electric power of high frequency to be inputted in two directions perpendicular to each other is set, so that plasma of high frequency can be uniformly distributed on the surface of the rectangular substrate 12 in accordance with a predetermined value. Therefore, it is possible to form a thin film of uniform thickness and uniform characteristic more easily than the case described in claim 5.

The invention described in the twelfth aspect provides the following effects. Phases of high frequency impressed upon and between the plate electrodes 24a to 24d of claim 5 or between the plate electrodes 28a and 28c, which are opposed to each other, or between the plate electrodes 28b and 28d, which are opposed to each other of claim 6, are synchronized with each other. Accordingly, it is possible to form a thin film of more uniform thickness and more uniform characteristic.

According to the thirteenth-sixteenth aspects, ion beams drawn out from the ion source into the film forming chamber are effectively irradiated onto the substrate. Therefore, according to the same action as that described in the sixth aspect, a size of the thin film forming apparatus can be further reduced and it becomes possible to form a thin film of uniform thickness and uniform characteristic.

What is claimed is:

1. A thin film forming apparatus, comprising:
   a substrate comprising a rectangular plate having a rectangular substrate surface, disposed in a film forming chamber;
   a high frequency generating means, having a high frequency electrode so as to form a plasma of high frequency in a shape of a rectangular parallelepiped, one side of the parallelepiped cross-section being parallel to the substrate surface and long enough to cover a corresponding side of the substrate surface; and
   a means for irradiating ion beams through the plasma and onto the substrate surface.

2. The thin film forming apparatus according to claim 1, wherein the high frequency electrode is formed so that the profile of the plasma of the high frequency has the same shape as the substrate surface, and covers the entire substrate surface.

3. The thin film forming apparatus according to claim 1, wherein the high frequency generating means comprises a plurality of power supplying parts and generates a high frequency in the UHF range.

4. The thin film forming apparatus according to claim 3, wherein the power supplying parts are arranged in a manner having same intervals along the high frequency electrode surface on a plane parallel to the substrate surface.

5. The thin film forming apparatus according to claim 1, wherein the high frequency is within a range between 27 MHz and 216 MHz.

6. The thin film forming apparatus according to claim 2, wherein the means for irradiating ion beams comprises an ion source so that ion beams are drawn into the film forming chamber through the plasma of high frequency and irradiate the entire surface of the substrate.

7. The thin film forming apparatus according to claim 2, wherein
   the thin film forming apparatus is provided with a substrate moving means for moving the substrate in a direction parallel to the one side of the parallelepiped cross-section.

8. The thin film forming apparatus according to claim 7, wherein the means for irradiating ion beams comprises an ion source so that ion beams are drawn into the film forming chamber through the plasma of high frequency and irradiate a region to be formed by the thin film.

9. The thin film forming apparatus according to claim 1, wherein the high frequency generating means comprises high frequency electrodes formed in such a manner that a plurality of plate electrodes are arranged into a square in the film forming chamber on the surface side of the substrate, the electrodes being electronically insulated from each other, and wherein the thin film forming apparatus is provided with a high frequency electronic power supplying means for supplying a high frequency electric power individually to each plate electrode so that the intensity of electronic power supplied to each plate electrode can be individually controlled.

10. The thin film forming apparatus according to claim 1, wherein the high frequency generating means comprises high frequency electrodes formed in such a manner that four plate electrodes are arranged into a square in the film forming chamber on the surface side of the substrate, the electrodes being electrically insulated from each other, and wherein the thin film forming apparatus is provided with a high frequency electric power supplying means for supplying a high frequency electric power individually to each plate electrode so that the intensity of electric power supplied to each plate electrode can be individually controlled.

11. The thin film forming apparatus according to claim 10, wherein the thin film forming apparatus is provided with a high frequency electric power feeding means for feeding a high frequency electric power respectively between two plate electrodes opposed to each other.

12. The thin film forming apparatus according to claim 11, wherein the thin film forming apparatus is provided with a means for synchronizing high frequency phases, which is impressed upon the plate electrodes or between the two plate electrodes opposed to each other.

13. The thin film forming apparatus according to claim 1, wherein the means for irradiating ion beams introduces the ion beams to the thin film forming chamber through a rectangular slit.

14. The thin film forming apparatus according to claim 1, wherein the means for irradiating ion beams introduces the ion beams to the thin film forming chamber through a slit sized the same as the substrate surface.

15. The thin film forming apparatus according to claim 1, wherein the means for irradiating ion beams introduces the ion beams to the thin film forming chamber through a plurality of holes formed on a plate having a slit.

16. The thin film forming apparatus according to claim 1, wherein the means for irradiating ion beams introduces the ion beams to the thin film forming chamber through a beam shielding plate having a slit, the slit having the same length as a long side of the substrate on which the thin film is to be formed.

* * * * *